United States Patent [19]
Ko et al.

[11] Patent Number: 5,877,909
[45] Date of Patent: Mar. 2, 1999

[54] CONTROL SIGNAL GENERATION APPARATUS FOR A DIGITAL INFORMATION SIGNAL RECORDING SYSTEM

[75] Inventors: Jung-wan Ko; Yong-deok Chang, both of Suwon, Rep. of Korea

[73] Assignee: Samsung Electronics Co., Ltd., Kyungki-do, Rep. of Korea

[21] Appl. No.: 691,368

[22] Filed: Aug. 2, 1996

[30] Foreign Application Priority Data

Aug. 3, 1995 [KR] Rep. of Korea ............... 95-23993

[51] Int. Cl.⁶ .................... G11B 5/09; H03M 5/00
[52] U.S. Cl. ................ 360/40; 360/51; 341/58
[58] Field of Search .............. 360/40, 51; 341/58, 341/59

[56] References Cited

U.S. PATENT DOCUMENTS

| | | | |
|---|---|---|---|
| 4,626,910 | 12/1986 | Kawamura | 348/447 |
| 5,140,474 | 8/1992 | Kahlman et al. | 360/77.14 |
| 5,142,421 | 8/1992 | Kahlman et al. | 360/40 |
| 5,245,483 | 9/1993 | Van Gestel | 360/40 |
| 5,432,651 | 7/1995 | Maeno et al. | 360/41 |
| 5,602,547 | 2/1997 | Maeno et al. | 360/40 |
| 5,659,577 | 8/1997 | Ohishi | 360/40 |

FOREIGN PATENT DOCUMENTS

| | | |
|---|---|---|
| 0 476 766 A1 | 3/1992 | European Pat. Off. . |
| 0 593 173 A2 | 4/1994 | European Pat. Off. . |
| 0 709 844 A2 | 5/1996 | European Pat. Off. . |
| 0 709 845 A2 | 5/1996 | European Pat. Off. . |
| 06-176495 | 6/1994 | Japan . |

*Primary Examiner*—W. R. Young
*Assistant Examiner*—Regina Y. Neal
*Attorney, Agent, or Firm*—Sughrue, Mion, Zinn, Macpeak & Seas, PLLC

[57] ABSTRACT

A control signal generation apparatus for use in a digital information signal recording system enables an optimum channel word of two channel words output from two precoders to be recorded on a digital record medium. The control signal generation apparatus compares the same kind of spectrum components from among peak, notch, and dip components detected from the two channel words, and generates a control signal for selecting an optimum channel word. The apparatus includes a gain controller for controlling the gains of integrators used for detecting the peak, notch, and dip components. The gain controller compares the detected peak, notch, and dip components with upper limit and lower limit set reference values, and generates a gain control signal according to the comparison results. Accordingly, the present invention can reduce the amount of required hardware circuitry, compared to the conventional apparatus which adds the peak, notch, and dip components detected from an individual channel word, and then compares the addition results with each other. An automatic gain controller is included which allows the number of the maximum allowable bits to be reduced, and which increases the processing speed of an integrator.

18 Claims, 8 Drawing Sheets

CONTROL SIGNAL GENERATION APPARATUS FOR A DIGITAL INFORMATION SIGNAL RECORDING SYSTEM

BACKGROUND OF THE INVENTION

1. Field of the Invention

The present invention relates to an apparatus for generating a control signal used in a recording device for recording a digital information signal on a digital recording medium. More particularly, it relates to an apparatus for generating a control signal concerning selection of a channel word to be recorded on an information track of a digital recording medium, in a recording device for recording channel words on information tracks in the magnetic recording medium, in which information words have (n+1) bits. Each of the information words, which has a one-bit digital word affixed thereto, is converted into an (n+1)-bit channel word by using precoders.

2. Background of the Related Art

A typical 8 mm video tape recording system records a recording signal together with a pilot signal on each recording track of a recording medium, in order to accurately control the recording tracks. However, a method for recording pilot signals which simply have different frequencies, together with recording signals is inefficient in terms of efficiently using the recording medium. This is because pilot signals in neighboring tracks should be located sufficiently far from a pilot signal in a track to be reproduced, in order not to cause crosstalk in the frequency domain, with the pilot signal.

To solve the above problem, a high-efficiency encoding technology is disclosed in U.S. Pat. No. 5,142,421 to Kahlman et al., issued on Aug. 25, 1992, entitled "Device For Recording A Digital Information Signal On A Record Carrier." This reference is described in detail below with reference to FIGS. 1 and 2.

Figure 1:
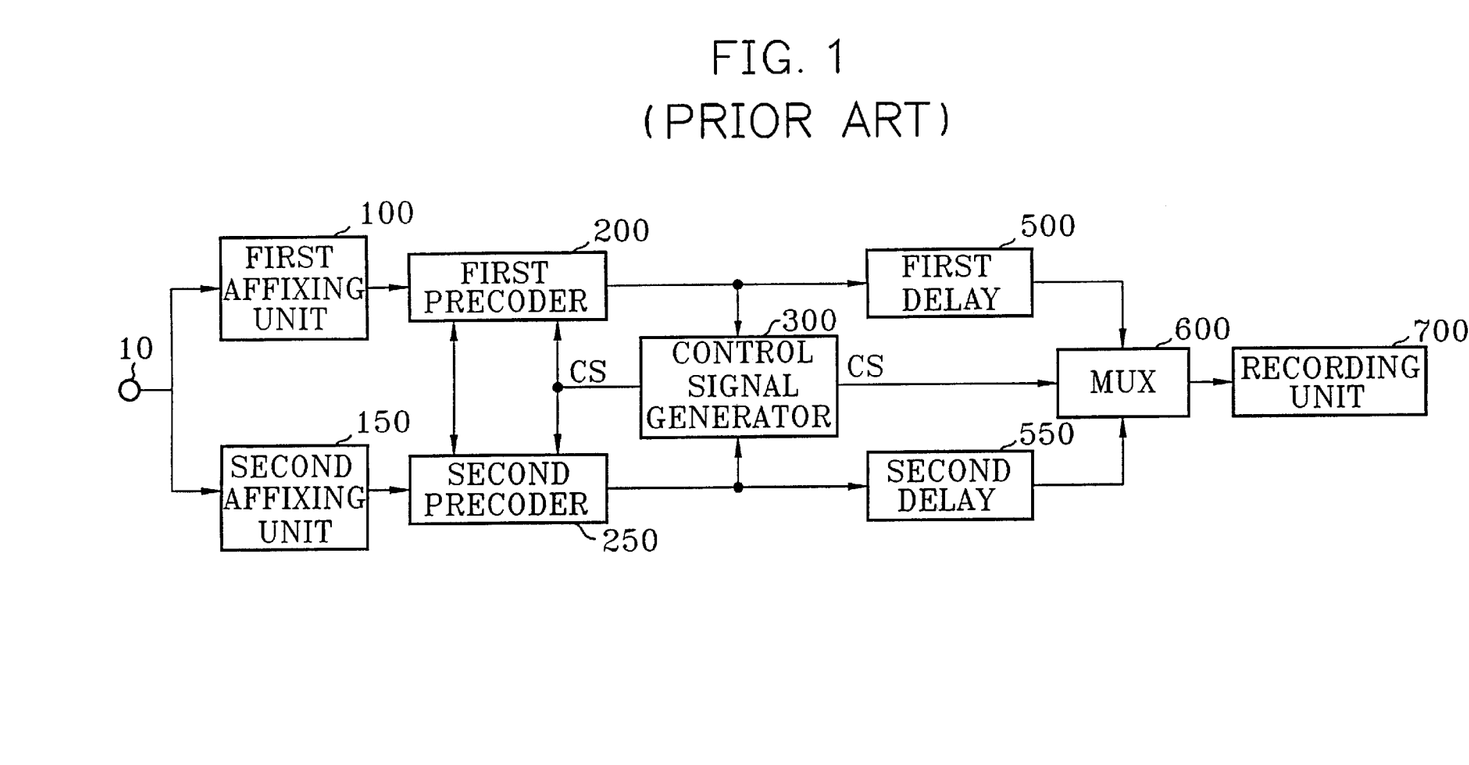
FIG. 1 is a block diagram of a conventional apparatus for recording a digital information signal on a record carrier.

FIG. 1 shows a device for recording a digital information signal on a recording carrier, which is referred to in the above reference. In FIG. 1, a first affixing unit 100 affixes a "0" to successive n-bit information words input via an input terminal 10, and a second affixing unit 150 affixes a "1" to successive n-bit information words. First and second precoders 200 and 250 convert the (n+1)-bit information words into (n+1)-bit channel words, respectively. The output of first precoder 200 is supplied to a control signal generator 300 and a first delay 500, and the output of second precoder 250 is supplied to control signal generator 300 and a second delay 550.

The control signal generator 300, shown in detail in FIG. 2 and described later in detail, generates a control signal CS using the supplied data. The control signal CS is supplied to first and second precoders 200 and 250 and also to a multiplexer 600. The first and second delays 500 and 550 delay the input data until control signal generator 300 generates a control signal corresponding to the input data. The multiplexer 600 selects one of the signals output from first and second delays 500 and 550 according to the control signal CS, and supplies the selected signal to a recording unit 700. The first and second precoders 200 and 250 operate to contain identical data in internal memories in response to control signal CS. For example, when the output data of first precoder 200 is transmitted to recording unit 700, the data contained in first precoder 200 is supplied to second precoder 250, with the result that first and second precoders 200 and 250 contain identical data.

Figure 2:
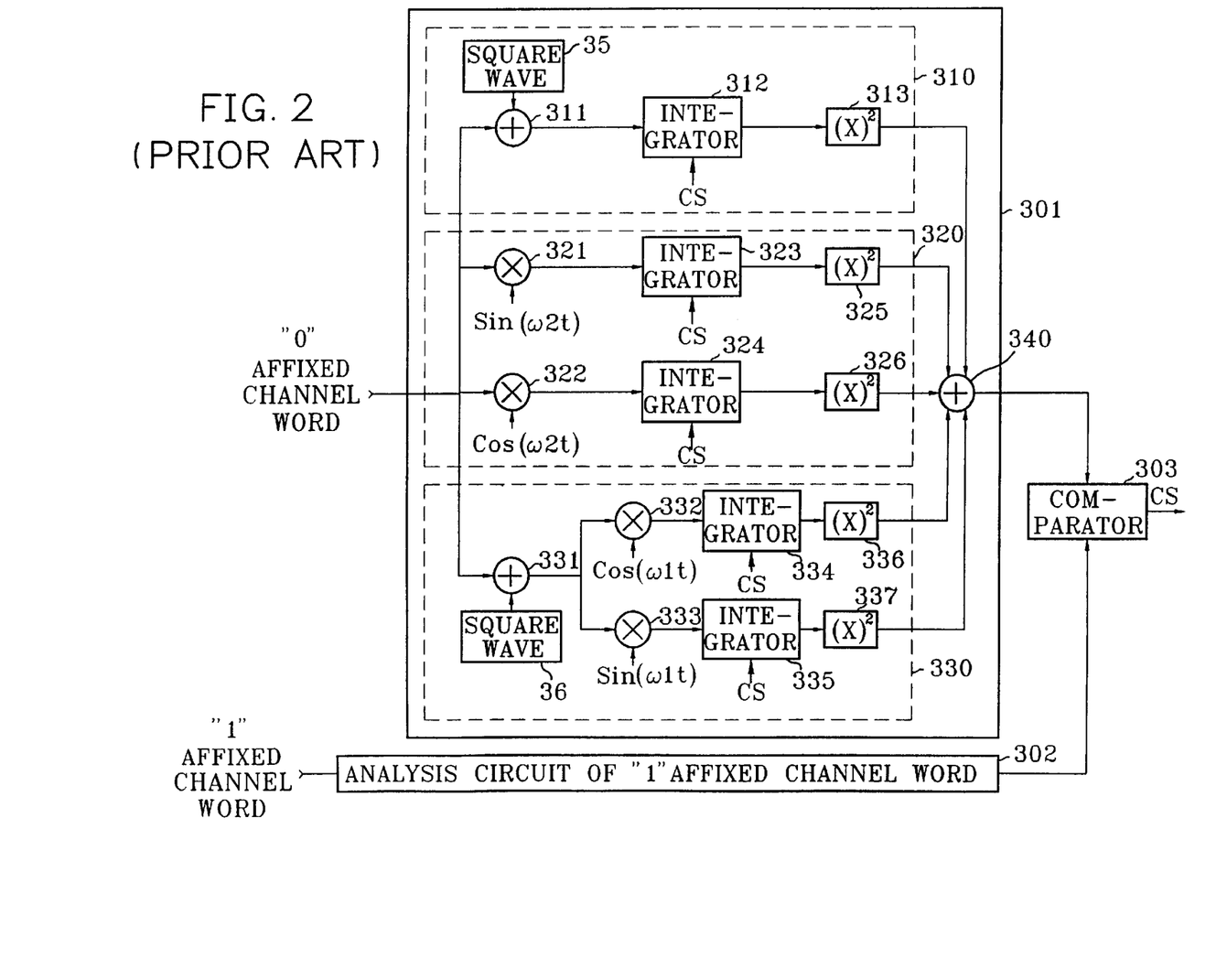
FIG. 2 is a detailed block diagram of the control signal generator 300 of FIG. 1.

FIG. 2 is a detailed block diagram of control signal generator 300 shown in FIG. 1. Control signal generator 300 includes, as shown in FIG. 2, a spectrum analysis circuit 301 which receives the signal output from first precoder 200, and a spectrum analysis circuit 302 which receives the signal output from second precoder 250. The spectrum analysis circuits 301 and 302 have the same structure, and accordingly, only spectrum analysis circuit 301 is shown in detail in FIG. 2. The spectrum analysis circuit 301 shown in detail in FIG. 2 is substantially the same as those shown in FIG. 17 of U.S. Pat. No. 5,142,421, except for an adder 311, an integrator 312 and a square wave generator 35. Since differences between the spectrum analysis circuit 301 of FIG. 2 and that of the FIG. 17 circuit of the above reference can be fully understood by one skilled in the art, the detailed description of the differences are omitted.

The spectrum analysis circuit 301 includes three spectrum component detectors, i.e., a peak detector 310 for detecting a peak component in which a particular frequency component is larger than a set reference value, a notch detector 320 for detecting a notch component capable of discriminating whether the particular frequency component is smaller than the set reference value, and a dip detector 330 for detecting a dip component assisting peak detection by attenuating the signal by a certain amount around the peak component. Peak detector 310, notch detector 320 and dip detector 330 detect, respectively, the peak, notch and dip components from the "0"-affixed channel word. An adder 340 sums signals output from detectors 310, 320 and 330. A spectrum analysis circuit 302 performs the same operation as that of the spectrum analysis circuit 301, except with respect to a "1"-affixed channel word. A comparator 303 compares the output signals of spectrum analysis circuits 301 and 302, to thereby generate the control signal CS.

Since the above adder 340 receives the five signals and sums all these signals, construction of the circuit is complicated. Also, an accurate result cannot be obtained unless relative gains are the same when each spectrum is estimated. Further, since the complicated circuit lengthens processing time, a digital circuit having a negative feedback loop requires a high-speed operational device to complete the negative feedback loop within a certain amount of time.

SUMMARY OF THE INVENTION

To solve the above problems, it is an object of the present invention to provide a control signal generation apparatus in a digital information signal recording system in which a circuit for analyzing a spectrum is simplified and the number of the maximum allowable bits of an integrator included in each spectrum detector is reduced, to thereby improve operational processing speed.

To accomplish the above object of the present invention, there is provided a control signal generation apparatus for receiving (n+1)-bit channel words and selecting an (n+1)-bit channel word which is supplied to a recording unit, for use in a system having means for affixing a one-bit digital word to each information in a digital information signal, precoders for coding successive (n+1)-bit information words to which one-bit digital word is affixed into (n+1)-bit channel words, recording means for recording the (n+1)-bit channel words supplied from the precoders on an information track in a magnetic record medium, and select means for selectively supplying one of the (n+1)-bit channel words from the precoders to the recording means in response to a control signal, the control signal generation apparatus comprising:

first spectrum detection means coupled to an output end of the precoder which generates a one-bit digital word, "0"- affixed (n+1)-bit channel word, for detecting peak, notch and dip components at a particular frequency from the (n+1)-bit channel words;

second spectrum detection means coupled to an output end of the precoder which generates a one-bit digital word, "1"-affixed (n+1)-bit channel word, for detecting peak, notch and dip components at the particular frequency from the (n+1)-bit channel words;

comparator means for comparing the spectrum components detected in the first and second spectrum detection means with the same kind of spectrum components, respectively;

means for determining which of the first and second spectrum detection means outputs more components having relatively small size, and generate the control signal indicating the decision result; and gain control means for comparing the peak, notch and dip components of the first and second spectrum detection means with upper limit and lower limit set reference values, and generating a gain control signal according to the comparison results.

The gain control signal is used for controlling the gains of the integrators in the first and second spectrum detection means.

BRIEF DESCRIPTION OF THE DRAWINGS

The preferred embodiments of the present invention are described with reference to the drawings wherein.

DETAILED DESCRIPTION OF THE PREFERRED EMBODIMENT

Preferred embodiments of the present invention are described below in more detail with reference to FIGS. 3 through 10.

Figure 3:
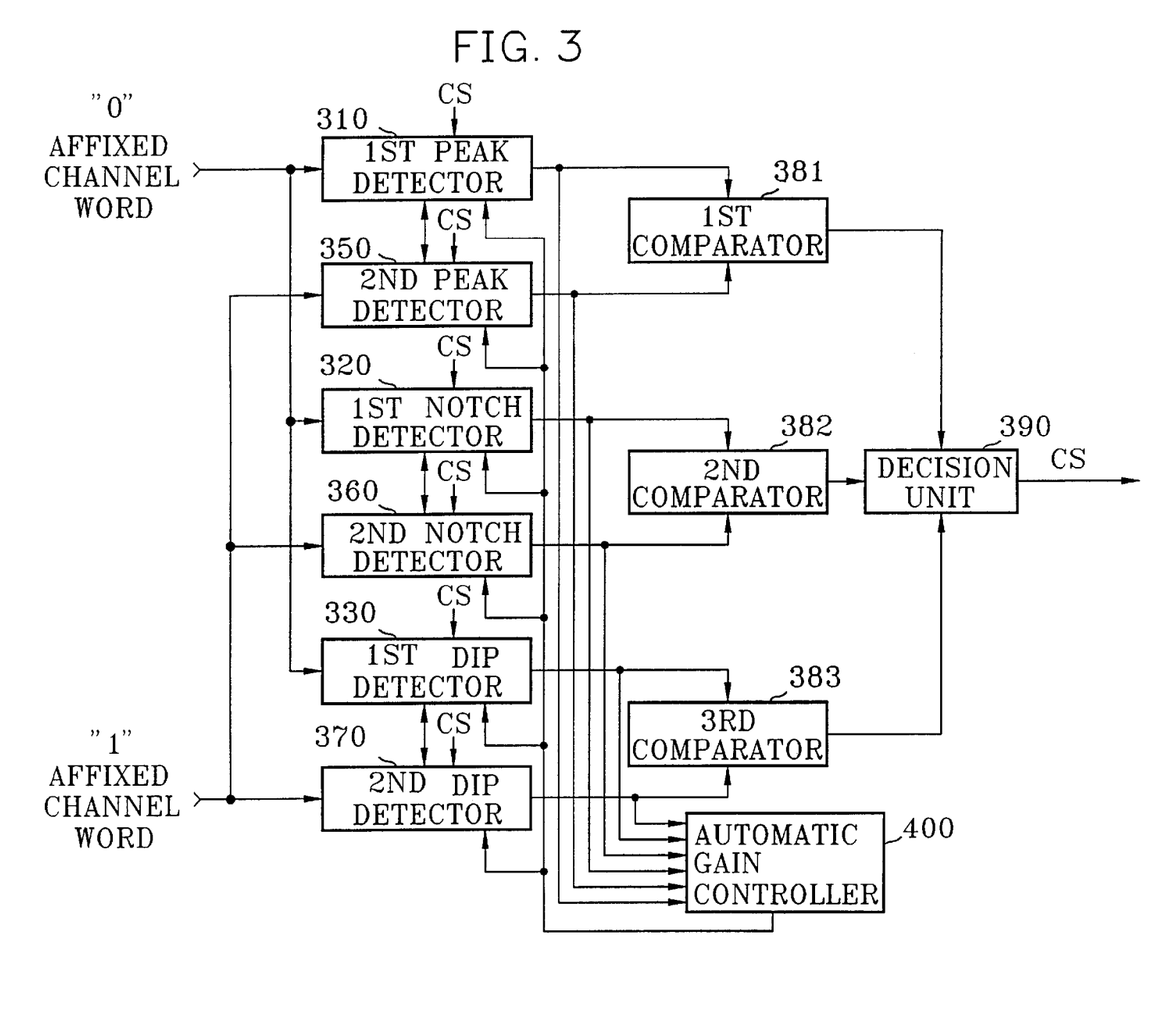
FIG. 3 is a block diagram of a control signal generation apparatus according to one embodiment of the present invention.

In FIG. 3 a control signal generation apparatus is shown according to the first embodiment of the present invention, which includes a first peak detector 310, a first notch detector 320 and a first dip detector 330, each of which receives a "0"-affixed channel word. A second peak detector 350, a second notch detector 360 and a second dip detector 370 each receive a "1"-affixed channel word, respectively. A first comparator 381 is connected to the outputs of first peak detector 310 and second peak detector 350. A second comparator 382 is connected to the outputs of first notch detector 320 and second notch detector 360. A third comparator 383 is connected to the outputs of first dip detector 330 and second dip detector 370. A decision unit 390 is connected to the outputs of first through third comparators 381–383, and generates a control signal CS.

The above spectrum component detectors 310 and 350, 320 and 360, and 330 and 370, for detecting identical spectrum components, receive a signal from the mutually corresponding spectrum component detector, respectively. Also, an automatic gain controller (AGC) 400 is connected to the outputs of spectrum component detectors 310, 320, 330, 350, 360 and 370. The AGC 400 supplies gain control signals GU and GD, which are described later in detail, to the spectrum component detectors 310, 320, 330, 350, 360 and 370.

The operation of the apparatus shown in FIG. 3 is described below referring to FIGS. 4 through 8 showing in detail the blocks of the control signal generation apparatus.

First peak detector 310, first notch detector 320 and first dip detector 330 detect a peak component, a notch component and a dip component from the received "0"-affixed channel word, respectively. Second peak detector 350, second notch detector 360 and second dip detector 370 detect the peak, notch and dip components, respectively, from the received "1"-affixed channel word. First through third comparators 381–383, which are connected to the outputs of the spectrum component detectors, compare the signals output from the identical spectrum component detectors. That is, first comparator 381 compares the signals output from first and second peak detectors 310 and 350 with each other and selects and outputs the signal which is smaller. Second and third comparators 382 and 383 select and output the signal which is smaller with respect to the notch and dip components, respectively, in the same manner as that of first comparator 381. Decision unit 390 generates a control signal CS which is determined based on two or more identical results from among the output signals of first through third comparators 381–383.

Figure 4:
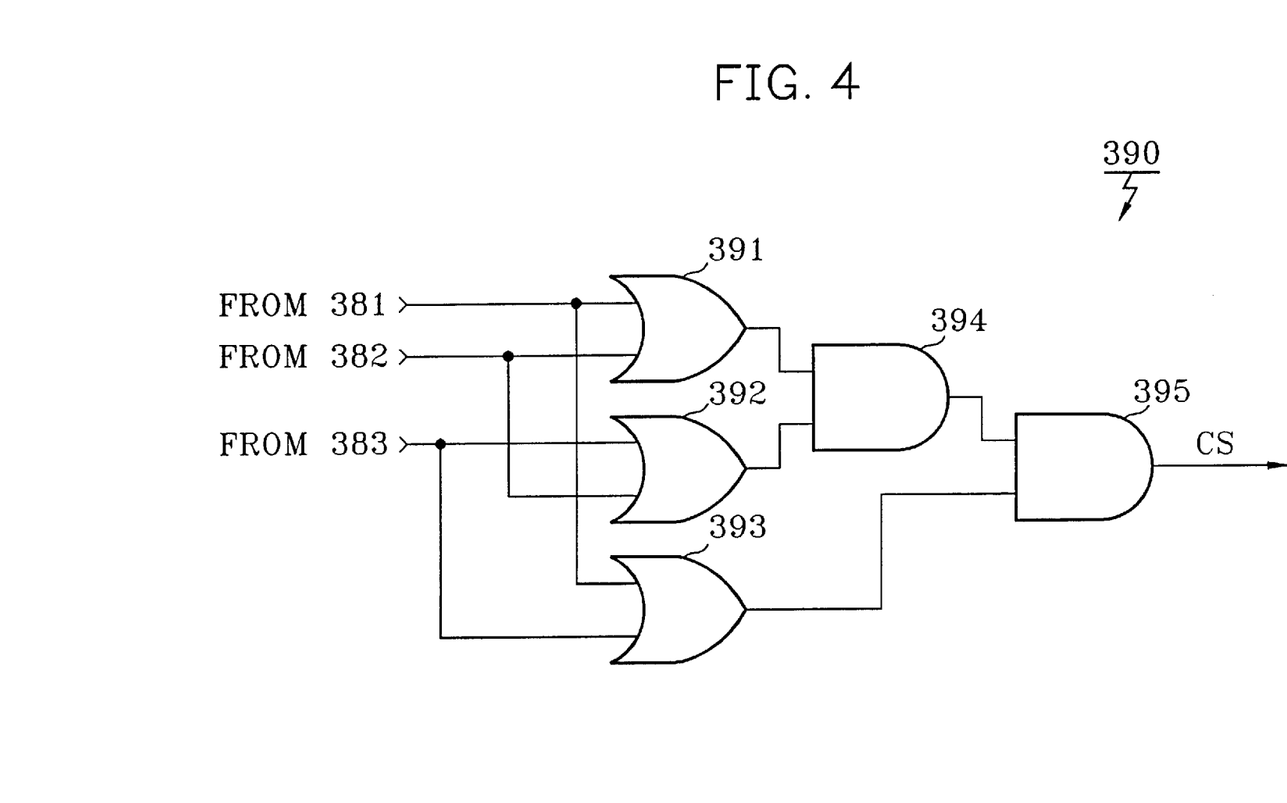
FIG. 4 is a detailed circuit diagram of the decision unit 390 of FIG. 3.

FIG. 4 is a detailed circuit diagram of decision unit 390 shown in FIG. 3. First through third OR gates 391–393 each logically sums two of the signals output from first through third comparators 381–383, respectively. A first AND gate 394 logically multiplies two of the signals output from first through third OR gates 391–393 (e.g., the outputs of the first and second OR gates shown in FIG. 4). Then, a second AND gate 395 logically multiplies the output signal of first AND gate 394 by the remaining output signal from among the output signals of the first through third OR gates 391–393, which is not input to first AND gate 394 (e.g., the output of the third OR gate 393 in FIG. 4). As a result, decision unit 390 outputs a control signal CS so that a signal which is selected more often from among the signals output from comparators 381–383, is determined.

In the prior art apparatus shown in FIG. 2, adder 340 having five inputs is constructed in such a manner that two of the five inputs are added first, and then the result of the first addition is added to one of the remaining three inputs. Accordingly, adder 340 can be composed of four adders each having two inputs. Thus, the prior art apparatus shown in FIG. 2 should include a total of eight adders. Meanwhile, the apparatus of FIG. 3 employs three comparators 381–383 rather than using adder 340. Since a comparator circuit is simpler than an adder circuit, the present invention reduces the amount of the hardware circuitry, yet outputs a result identical to that in which the signals are added and then compared.

Figure 5:
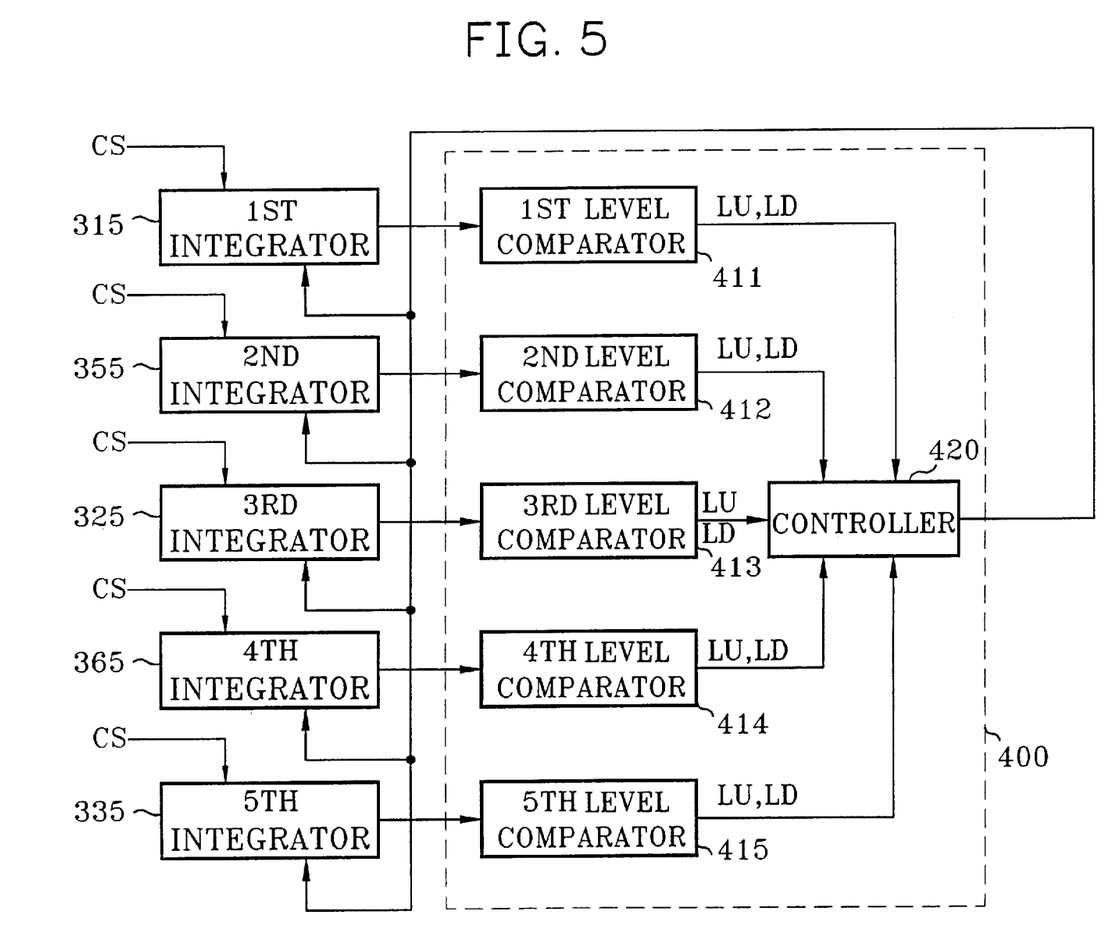
FIG. 5 is a detailed circuit diagram of the automatic gain controller 400 of FIG. 3.

FIG. 5 is a detailed circuit diagram of automatic gain controller 400 shown in FIG. 3. First through fifth level comparators 411~415 in automatic gain controller 400 receive the signals output from first through fifth integrators 315, 355, 325, 365, and 335, and compare the received signals with upper limit and lower limit set reference values, $T_{high}$ and $T_{low}$, respectively. Accordingly, first through fifth level comparators 411–415 generate level control signals LU and LD for increasing, or leveling-up, or decreasing, or leveling-down, the level, respectively. A controller 420 receives level control signals LU and LD from first through fifth level comparators 411–415, and generates gain control signals GU and GD for increasing and decreasing the gain, respectively. Then, gain control signals GU and GD are supplied to first through fifth integrators 315, 355, 325, 365, and 335, respectively. Here, the first through fifth integrators correspond to the first and second peak, notch and dip detectors, respectively.

Figure 6:
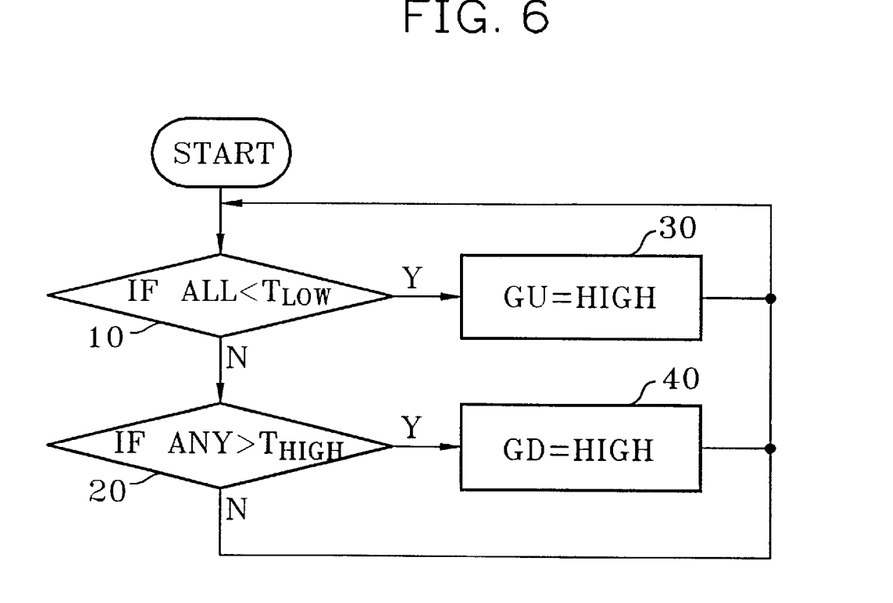
FIG. 6 is a flowchart diagram showing a gain control signal generation procedure employed in controller 420 of FIG. 5.

FIG. 6 is a flowchart diagram showing the process of generating gain control signals GU and GD in controller 420 shown in FIG. 5. When the level-up signals LUs of first through fifth level comparators 411–415 are all at a high level, that is, when the output signals of first through fifth level comparators 411–415 are all smaller than lower limit set reference value $T_{low}$ in step 10, controller 420 outputs a high-level gain-up signal GU for increasing the gain in step 20. Then, when there is one or more high-level signal among the level-down signals LUs, a signal which is larger than upper limit set reference value $T_{high}$ exists among the output signals of the integrators (step 20). In this case, the gain-down signal (GD) is set to a high-level in order to decrease the gain, in step 40.

Figure 7:
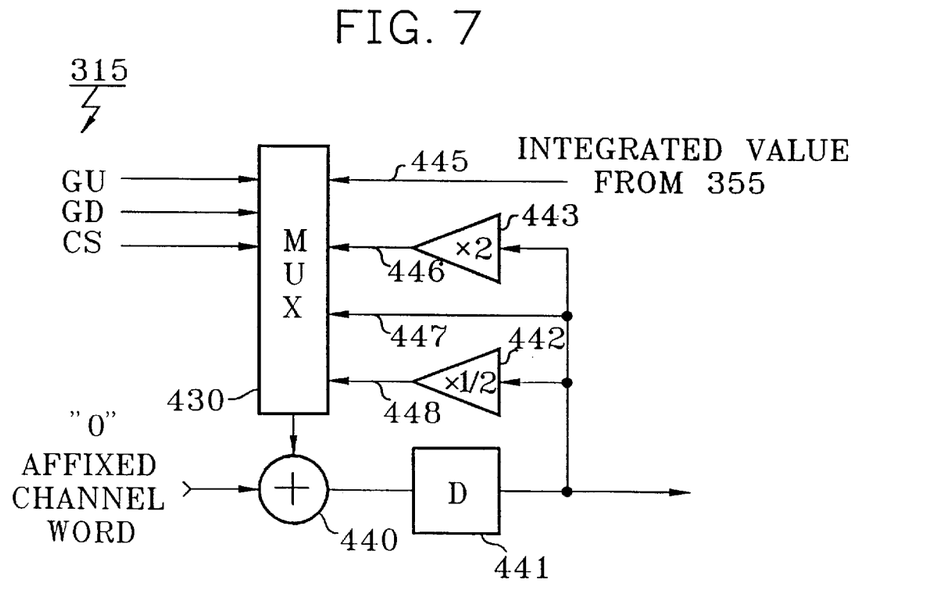
FIG. 7 is a detailed circuit diagram of integrators 315, 355, 325, 365, 335 or 375 of FIG. 5.

FIG. 7 is a detailed circuit diagram of integrator 315 for performing a gain control function by the apparatus, as shown in FIG. 5. In FIG. 7, an adder 440 adds either the "0"- or "1"-affixed channel word with the output signal of a multiplexer 430. A D-flip-flop 441 delays the output signal of adder 440 by a predetermined time. A first amplifier 442 amplifies the output signal of D-flip-flop 441 by a factor of one-half. A second amplifier 443 amplifies the output signal of D-flip-flop 441 by a factor of two.

Multiplexer 430 receives the gain control signals GU and GD from controller 420 shown in FIG. 5 and control signal CS of FIG. 4, and selects one of the signals input thereto corresponding to the integrated value stored in D-flip-flop 441 multiplied by factors of one-half (448), 1 (447) and 2 (446) and the integrated value 445 of the corresponding spectrum component detector 355. Then, multiplexer 430 negatively feeds back the selected signal to adder 440.

Figure 8:
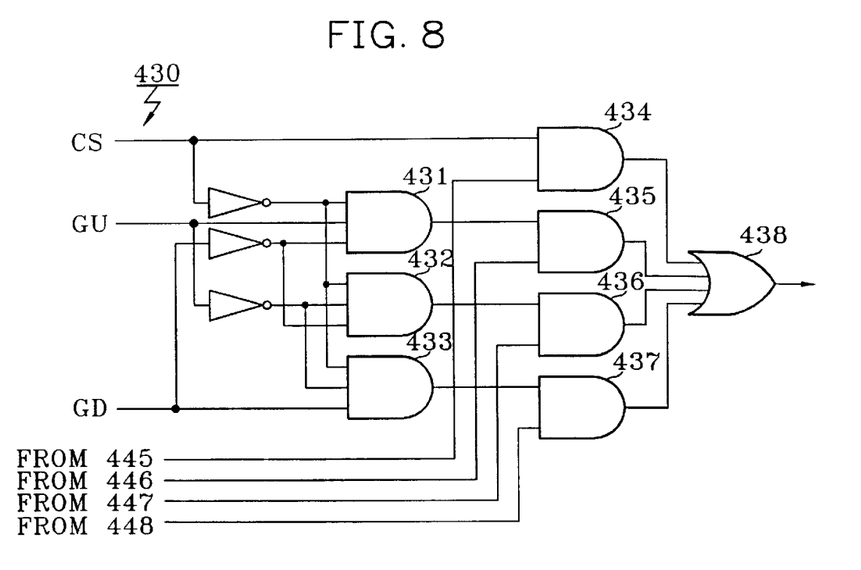
FIG. 8 is a detailed circuit diagram of multiplexer 430 of FIG. 7.

FIG. 8 is a detailed circuit diagram of multiplexer 430 shown in FIG. 7. In FIG. 8, a third AND gate 431 logically multiplies an inverted control signal CS, a gain-up signal GU and an inverted gain-down signal GD. A fourth AND gate 432 logically multiplies the inverted control signal CS, an inverted gain-up signal GU and the inverted gain-down signal GD. A fifth AND gate 433 logically multiplies the inverted control signal CS, the inverted gain-up signal GU, and a gain-down signal GD. A sixth AND gate 434 logically multiplies the control signal CS and the integration value 445 output from detector 355. A seventh AND gate 435 logically multiplies the signal output from third AND gate 431 and the integration value 446 which corresponds to the integration value of D-flip-flop 441 multiplied by a factor of two. An eighth AND gate 436 logically multiplies the signal output from fourth AND gate 432 and the integration value 447 output from D-flip-flop 441. A ninth AND gate 437 logically multiplies the output signal of the fifth AND gate 433 and the integration value 448 corresponding to the integration value of D-flip-flop 441 multiplied by a factor of one-half. A fourth OR gate 438 logically sums the signals output from sixth through ninth AND gates 434–437. The fourth OR gate 438 shown in FIG. 8 outputs the integration value 445 of the relative detector 355 when the control signal CS provided via the sixth AND gate 434 has a high level. Also, if the gain-up signal GU has a high level when the control signal CS is at a low level, the value 446 being two times the integration value of D-flip-flop 441 is selected to thereby increase the gain. Meanwhile, if the gain-down signal GD is at a high level, the value 448 which is one-half the integration value of D-flip-flop 441 is selected to thereby decrease the gain. Then, if the gain-up and gain-down signals GU and GD both are at a low level, the integration value 447 of D-flip-flop 441 is output. The signal selected in the fourth OR gate 438 is applied to adder 440 of FIG. 7, and is added to the "0"- or "1"-affixed signal therein.

By experiment, the integrators of FIG. 2 should be constructed with an internal adder circuit having a minimum of 16 bits. However, the present invention uses the gain controller to thereby reduce the number of the maximum allowable bits in the integrator, down to 12 bits or less. More specifically, the number of maximum allowable bits for the integrators in the peak and notch detectors can be reduced down to 10 bits. Also, the comparators can be structured so that only some of the upper bits of the input signal are used.

The present invention can independently constitute the gain relationship with respect to the identical spectrum component detection paths. Such an example is shown in FIGS. 9 and 10.

Figure 9:
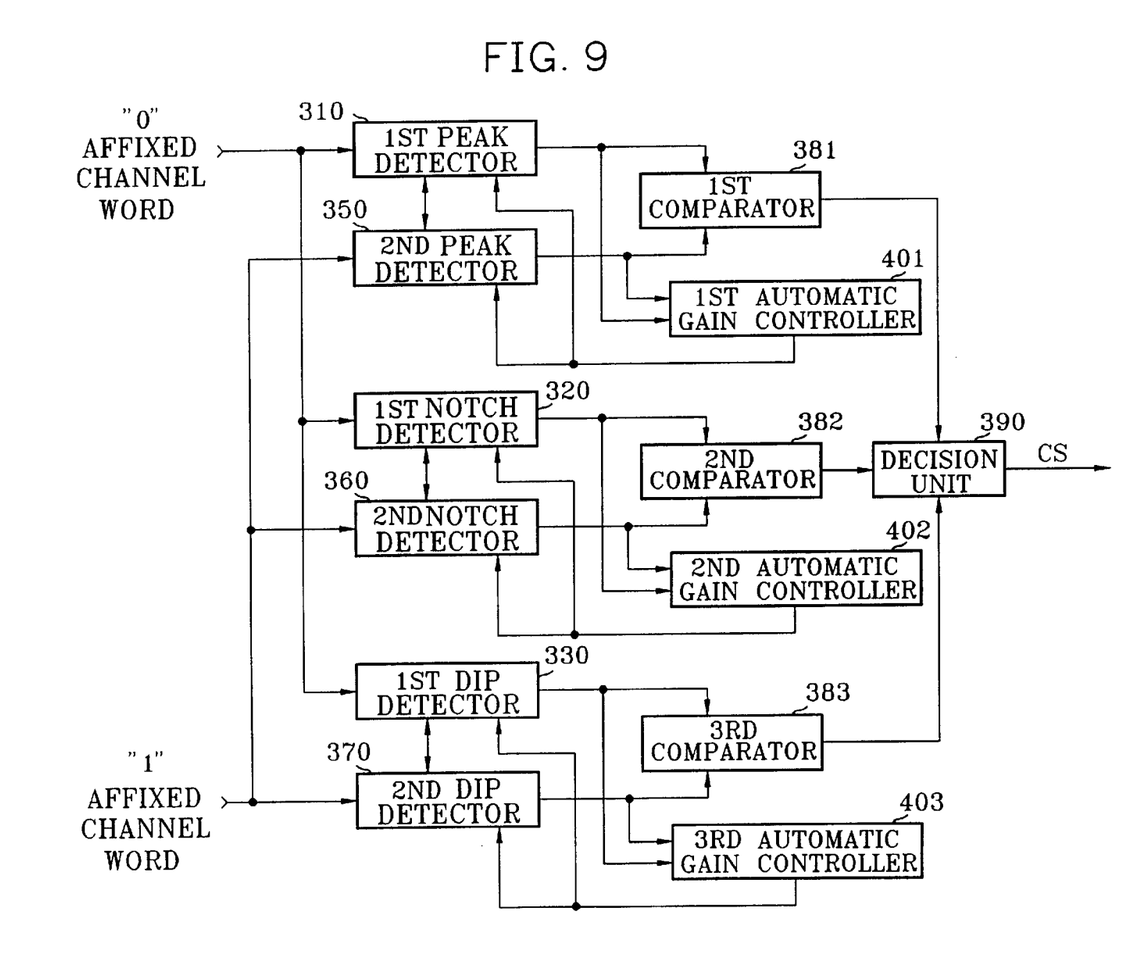
FIG. 9 is a block diagram of a control signal generation apparatus according to another embodiment of the present invention.

FIG. 9 is a block diagram of a control signal generation apparatus according to another embodiment of the present invention. In FIG. 9, a first automatic gain controller 401 is connected to the outputs of a first peak detector 310 and a second peak detector 350. Likewise, a second automatic gain controller 402 is connected to the outputs of a first notch detector 320 and a second notch detector 360. Likewise, a third automatic gain controller 403 is connected to the outputs of a first dip detector 330 and a second dip detector 370. Since the other elements of FIG. 9 are same as those shown in FIG. 3, the detailed description thereof will be omitted.

Figure 10:
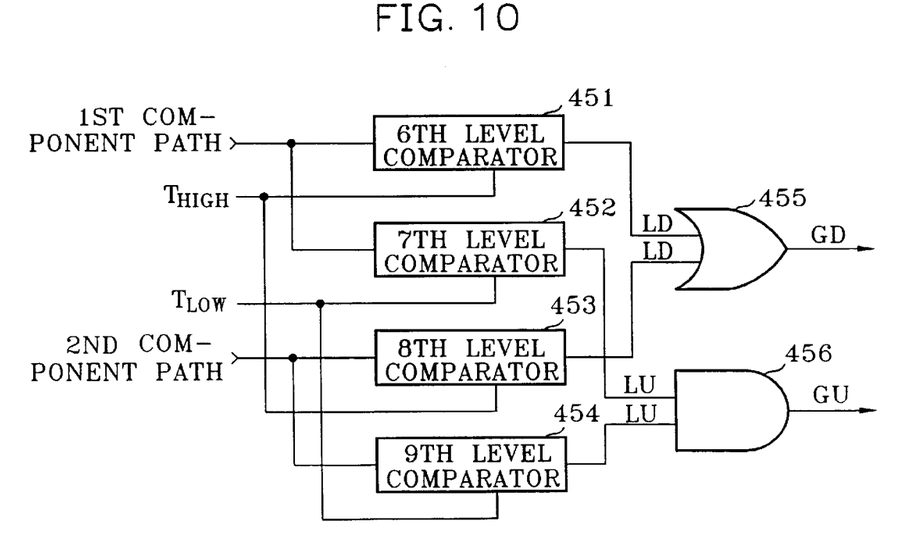
FIG. 10 is a detailed circuit diagram of automatic gain controllers 401, 402 or 403 of FIG. 9.

FIG. 10 is a detailed circuit diagram of the first, second or third automatic gain controllers 401, 402 or 403 shown in FIG. 9. In FIG. 10, a sixth level comparator 451 compares the output signal of the first component such as a peak, notch or dip component, with an upper limit set reference value $T_{high}$. A seventh level comparator 452 compares the output signal of the first component with a lower limit set reference value $T_{low}$. An eighth level comparator 453 compares the output signal of the second component, such as a peak, notch or dip component, with an upper limit set reference value $T_{high}$. A ninth level comparator 454 compares the output signal of the second component, with a lower limit set reference value $T_{low}$. An OR gate 455 logically sums the output signals of the sixth and eighth level comparators 451 and 453. An AND gate 456 logically multiplies the output signals of the seventh and ninth level comparators 452 and 454.

The sixth and eighth level comparators 451 and 453 compare the input signals with the upper limit set reference value $T_{high}$, respectively. Then, The sixth and eighth level comparators 451 and 453 output the comparison results as a level-down signal LD, respectively. The OR gate 455 generates a gain-down signal GD according to the received level-down signals LD. The seventh and ninth level comparators 452 and 454 compare the input signals with the lower limit set reference value $T_{low}$, respectively. Then, the seventh and ninth level comparators 452 and 454 output the comparison results as a level-up signal LU, respectively. The AND gate 456 generates a gain-up signal GU according to the received level-up signals LU.

As described above, the control signal generation apparatus for the digital information signal recording system according to the present invention, compares the same kind of components with each other from the "0"- or "1"-affixed signal, selects one of them, and improves a decision unit so that the more frequently selected signal should be selected, to thereby reduce an amount of circuit hardware. Also, the present invention uses an automatic gain controller to reduce the maximum number of allowable bits. Accordingly, the present invention can increase an operational processing speed of an integrator.

While only certain embodiments of the invention have been specifically described herein, it will apparent that numerous modifications may be made thereto without departing from the spirit and scope of the invention.

What is claimed is:

1. A control signal generation apparatus for receiving an (n+1)-bit channel word and selecting the (n30 1)-bit channel word which is to be supplied to a recording unit, for use in a system having means for affixing a one-bit digital word to an n-bit information word in a digital information signal, precoders for coding successive (n+1)-bit information words to which the one-bit digital word is affixed into (n+1)-bit channel words, recording means for recording the (n+1)-bit channel words supplied from the precoders on an information track in a magnetic record medium, and selection means for selectively supplying one of the (n+1)-bit channel words from the precoders to the recording means in response to a control signal, the control signal generation apparatus comprising:

first spectrum detection means coupled to an output end of the precoder which generates a one-bit digital word, "0"-affixed (n+1)-bit channel word, for detecting from the "0"-affixed (n+1)-bit channel words peak, notch and dip spectrum components at a particular frequency;

second spectrum detection means coupled to an output end of the precoder which generates a one-bit digital word, "1"-affixed (n+1)-bit channel word, for detecting from the "1" affixed (n+1)-bit channel words the peak, notch and dip spectrum components at said particular frequency;

comparator means for comparing the peak spectrum components detected in said first and second spectrum detection means, comparing the notch spectrum components detected in said first and second spectrum detection means, and comparing the dip spectrum components detected in said first and second spectrum detection means, and outputting peak, notch and dip comparison signals based on the comparisons; and control signal generating means for generating the control signal based on said peak, notch and dip comparison signals.

2. The control signal generation apparatus according to claim 1, wherein said comparator means selects and outputs the smaller of the spectrum components of said first and second spectrum detection means.

3. The control signal generation apparatus according to claim 2, wherein said control signal generating means receives another comparison signal from another comparator means which compares spectrum components of another first spectrum detection means which receives said "0"-affixed (n+1)-bit channel words and another second spectrum detection means which receives said "1"-affixed (n+1)-bit channel words, and determines which of the first and second spectrum detection means outputs more components having a relatively small size, and generates the control signal indicating the result of the determination.

4. The control signal generation apparatus according to claim 1 further comprising gain control means for comparing the spectrum components of said first and second spectrum detection means with upper limit and lower limit set reference values, and generating a gain control signal according to a result of the comparison, wherein each of said first and second spectrum detection means comprises a plurality of integrators used for generating peak, notch and dip components, in which an individual integrator controls the gain of an input signal according to the gain control signal of the gain control means.

5. The control signal generation apparatus according to claim 4, wherein said gain control means generates the gain control signal causing the gains of said first and second spectrum detection means to increase when all the peak, notch, and dip components are smaller than the lower limit set reference value, and causing the gains of said first and second spectrum detection means to decrease when at least one of the peak, notch, and dip components is larger than the upper limit set reference value.

6. The control signal generation apparatus according to claim 5, wherein respective integrators control input signals thereto to have the same gain with each other in accordance with the gain control signal.

7. The control signal generation apparatus according to claim 6, wherein each integrator contained in one of said first and second spectrum detection means comprises:

a latch for storing an input signal;

a first amplifier for amplifying an output signal from said latch by a factor of two;

a second amplifier for amplifying the output signal from said latch by a factor of one-half;

a multiplexer for receiving an integrated value from another integrator which is contained in the other one of said first and second spectrum detection means, an output signal of said latch, and output signals of said first and second amplifiers, and selecting and outputting one of the received signals according to the control signal and gain control signal; and an adder for adding the signal output from said multiplexer and a channel word to which the 1-bit digital word is affixed.

8. The control signal generation apparatus according to claim 1, the apparatus further comprising:

a first gain controller for comparing peak components of the spectrum components of said first and second spectrum detection means with a predetermined upper limit and lower limit set reference values, respectively, and generating a first gain control signal according to a result of the comparison;

a second gain controller for comparing notch components of the spectrum components of said first and second spectrum detection means with the upper limit and lower limit set reference values, respectively, and generating a second gain control signal according to a result of the comparison; and a third gain controller for comparing dip components of the spectrum components of said first and second spectrum detection means with the predetermined upper limit and lower limit set reference values, respectively, and generating a third gain control signal according to a result of the comparison, wherein each of said first and second spectrum detection means comprises a plurality of integrators for generating the peak, notch and dip components, in which one of the integrators controls the gain of an input signal according to one of the first through third gain control signals.

9. The control signal generation apparatus according to claim 8, wherein each of said first through third gain controllers generates the gain control signal causing the gain to increase when all the peak, dip and notch components are smaller than the lower limit set reference value, and causing the gain to decrease when at least one of the peak, dip and notch components is larger than the upper limit set reference value.

10. A recording apparatus, comprising:

an affixing unit for receiving an n-bit information word and affixing a one-bit digital word thereto and outputting an (n+1) bit information word;

a first precoder for coding successive (n+1)-bit information words into (n+1)-bit channel words, affixed with a "0";

a second precoder for coding successive (n+1)-bit information words into (n+1)-bit channel words, affixed with a "1";

a control signal generator comprising:

a first spectrum detector coupled to an output end of said first precoder for detecting from the "0"-affixed (n+1)-bit channel word peak, notch and dip spectrum components at a particular frequency;

a second spectrum detector coupled to an output end of said second precoder for detecting from the "1" affixed (n+1)-bit channel words the peak, notch and dip spectrum components at said particular frequency;

a comparator for comparing the peak spectrum components detected in said first and second spectrum detectors, comparing the notch spectrum components detected in said first and second spectrum detectors, and comparing the dip spectrum components detected in said first and second spectrum detectors, and outputting peak, notch and dip comparison signals; and a decision unit for generating a control signal based on said peak, notch and dip comparison signals;

a selector for selectively outputting one of the (n+1)-bit channel words from one of the first and second precoders in response to the control signal; and a recording unit for recording the (n+1)-bit channel word supplied from said selector on an information track in a magnetic record medium.

11. The recording apparatus according to claim 10, wherein said comparator selects and outputs the smaller of the spectrum components of said first and second spectrum detectors.

12. The recording apparatus according to claim 11, wherein said control signal generator receives another comparison signal from another comparator which compares spectrum components of another first spectrum detector which receives said "0"-affixed (n+1)-bit channel words and another second spectrum detector which receives said "1"-affixed (n+1)-bit channel words, and determines which of the first and second spectrum detectors outputs more components having a relatively small size, and generates the control signal indicating the result of the determination.

13. The recording apparatus according to claim 10 further comprising gain controller for comparing the spectrum components of said first and second spectrum detectors with upper limit and lower limit set reference values, and generating a gain control signal according to a result of the comparison, wherein each of said first and second spectrum detectors comprises a plurality of integrators used for generating peak, notch and dip components, in which an individual integrator controls the gain of an input signal according to the gain control signal of the gain controller.

14. The recording apparatus according to claim 13, wherein said gain controller generates the gain control signal causing the gains of said first and second spectrum detectors to increase when all the peak, notch, and dip components are smaller than the lower limit set reference value, and causing the gains of said first and second spectrum detectors to decrease when at least one of the peak, notch, and dip components is larger than the upper limit set reference value.

15. The recording apparatus according to claim 14, wherein respective integrators control input signals thereto to have the same gain with each other in accordance with the gain control signal.

16. The recording apparatus according to claim 15, wherein each integrator contained in one of said first and second spectrum detectors comprises:

a latch for storing an input signal;

a first amplifier for amplifying an output signal from said latch by a factor of two;

a second amplifier for amplifying the output signal from said latch by a factor of one-half;

a multiplexer for receiving an integrated value from another integrator which is contained in the other one of said first and second spectrum detection means, an output signal of said latch, and output signals of said first and second amplifiers, and selecting and outputting one of the received signals according to the control signal and gain control signal; and an adder for adding the signal output from said multiplexer and a channel word to which the 1-bit digital word is affixed.

17. The recording apparatus according to claim 10, further comprising:

a first gain controller for comparing peak components of the spectrum components of said first and second spectrum detectors with a predetermined upper limit and lower limit set reference values, respectively, and generating a first gain control signal according to a result of the comparison;

a second gain controller for comparing notch components of the spectrum components of said first and second spectrum detectors with the upper limit and lower limit set reference values, respectively, and generating a second gain control signal according to a result of the comparison; and a third gain controller for comparing dip components of the spectrum components of said first and second spectrum detectors with the predetermined upper limit and lower limit set reference values, respectively, and generating a third gain control signal according to a result of the comparison, wherein each of said first and second spectrum detectors comprises a plurality of integrators for generating the peak, notch and dip components, in which one of the integrators controls the gain of an input signal according to one of the first through third gain control signals.

18. The recording apparatus according to claim 17, wherein each of said first through third gain controllers generates the gain control signal causing the gain to increase when all the peak, dip and notch components are smaller than the lower limit set reference value, and causing the gain to decrease when at least one of the peak, dip and notch components is larger than the upper limit set reference value.

* * * * *